(12) United States Patent
Lee et al.

(10) Patent No.: US 7,301,216 B2
(45) Date of Patent: *Nov. 27, 2007

(54) FUSE STRUCTURE

(75) Inventors: Chiu-Te Lee, Hsin-Chu (TW); Te-Yuan Wu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 159 days.

This patent is subject to a terminal disclaimer.

(21) Appl. No.: 10/711,790

(22) Filed: Oct. 5, 2004

(65) Prior Publication Data

US 2005/0040491 A1 Feb. 24, 2005

Related U.S. Application Data

(63) Continuation-in-part of application No. 10/064,052, filed on Jun. 5, 2002, now Pat. No. 6,864,124.

(51) Int. Cl.
*H01L 29/00* (2006.01)

(52) U.S. Cl. ............... 257/529; 257/530; 257/762; 257/E21.592; 257/E23.147; 438/131; 438/132

(58) Field of Classification Search ............ 257/529, 257/762
See application file for complete search history.

(56) References Cited

U.S. PATENT DOCUMENTS

| | | | |
|---|---|---|---|
| 5,519,658 A * | 5/1996 | Uda et al. .................. 365/200 |
| 5,882,998 A | 3/1999 | Sur, Jr. et al. |
| 6,175,145 B1 * | 1/2001 | Lee et al. .................. 257/529 |
| 6,194,304 B1 * | 2/2001 | Morozumi et al. ......... 438/618 |
| 6,356,496 B1 * | 3/2002 | Carroll et al. ........... 365/225.7 |
| 6,375,159 B2 * | 4/2002 | Daubenspeck et al. ..... 257/529 |
| 6,707,129 B2 | 3/2004 | Wang |
| 6,828,653 B1 | 12/2004 | Castagnetti et al. |
| 6,900,515 B2 * | 5/2005 | Fischer et al. .............. 257/528 |
| 2005/0110148 A1 * | 5/2005 | Lee et al. .................. 257/758 |

* cited by examiner

*Primary Examiner*—Andy Huynh
*Assistant Examiner*—Dao H. Nguyen
(74) *Attorney, Agent, or Firm*—Winston Hsu

(57) ABSTRACT

A metal layer structure is disclosed. The metal layer structure includes a substrate, a first dielectric layer on a surface of the substrate, and at least one first conductor and at least one second conductor on the first dielectric layer. The second conductor has at least one thin portion.

11 Claims, 2 Drawing Sheets

FUSE STRUCTURE

CROSS REFERENCE TO RELATED APPLICATIONS

This is a continuation-in-part of U.S. application Ser. No. 10/064,052, filed Jun. 5, 2002, now U.S. Pat. No. 6,864,124 and which is included herein by reference.

BACKGROUND OF INVENTION

1. Field of the Invention

The present invention relates to a fuse structure, and more particularly, to a fuse structure having at least one fuse including a thin portion and a thick portion formed from a single-layered material.

2. Description of the Prior Art

Aluminum alloys with silicon dioxide ($SiO_2$) dielectrics have been the materials of choice for interconnect systems since the dawn of the integrated circuit (IC) era. These materials were convenient to process using mature subtractive etch processes for metal line patterning. However, as ICs have relentlessly marched down the path towards smaller geometry and to a deep sub-micron generation in the pursuit of increased speed, the traditional $Al/SiO_2$ interconnect system has shown itself to be a limiting factor. Cu-dual damascene architectures with low-k dielectrics are thus developing and becoming the norm now in forming interconnects. Overall, RC delays occurring during signal transmission are reduced and operating performance is improved because Cu has a 40% less resistivity compared with aluminum, and low-k materials reduce the capacitance between interconnections.

In an integrated circuit, each transistor or cell needs to be electrically connected to corresponding metal lines within different metal layers after being formed. Then the transistors are electrically connected to bonding pads through each metal line. After being packaged, the integrated circuit is electrically connected to an external circuit through terminals, which are electrically connected to bonding pads. In a memory device, structures known as fuses are usually formed within the top metal layer. If there are portions of malfunctioning memory cells, word lines, or metal lines in a completed memory device, some redundant cells, redundant word lines, or redundant metal lines are utilized to replace them. The method is to use a laser zip step to sever fuses. Then a laser repair step including laser cutting, laser linking, etc., is used to sever the original electrical connection to the malfunctioning memory cells, word lines, or metal lines, or to form some new electrical connection to compensate the useless memory cells, word lines, or metal lines.

Please refer to FIG. 1. FIG. 1 is a schematic diagram of a fuse structure 10 on a semiconductor wafer according to the prior art. As shown in FIG. 1, the prior art fuse structure 10 comprises at least one memory cell (not shown) or at least one transistor (not shown) disposed on a silicon substrate 11 on a semiconductor wafer 12 and individual metal lines 14. Different metal lines 12 are isolated by a first dielectric layer 16.

The metal line 14 comprises an aluminum line or a copper line. In the case where the aluminum lines are used, a continuous process including deposition, photolithography, and etching is utilized. In the case where the copper lines are used, a dual damascence process is usually utilized. The reason is that the aluminum lines are usually formed by a DC magnetron sputtering process, which is characterized by its poor step coverage ability. In the process generation beyond 0.13 μm, line width is smaller, aspect ratio is relatively increased, and the poor step coverage ability causes a severe problem. Although a high temperature (>400° C.) aluminum process with an improved step coverage ability due to a high surface migration rate at high temperature has been developed, it is not satisfactory. However, aluminum is easily deposited and etched, and is very cheap as well. Thus, the aluminum line is widely utilized in semiconductor factories. Although the cooper lines are superior to the aluminum lines in terms of electrical performance, the etching process for the copper lines cannot be done in a chemical way because of the poor volatile ability of copper-chloride-alloy, which is a drawback of the copper lines. The copper is etched by physical momentum produced by the bombardment of ions in plasma on the copper, hence the copper lines is formed by the dual damascence process to skip the etching process for copper.

The fuse structure 10 further comprises a second dielectric layer 18 disposed on the first dielectric layer 16 and the metal lines 14, at least one conductive plug 22 disposed in the second dielectric layer 18, and at least one bonding pad 24 and at least one fuse 26 disposed on the second dielectric layer 18. Similar to the metal lines 14, the composition material for both the bonding pad 24 and the fuse 26 comprises aluminum or copper. Therefore, the conductive plug 22 may be formed by forming a via hole 28 extending from the top surface of the metal lines 14 up to the top surface of the second dielectric layer 18 first, followed by filling metal material into the via hole 28. After that, the bonding pad 24 and the fuse 26 are formed on top of the corresponding conductive plug 22 by utilizing a continuous deposition, photolithography, and anisotropic dry etching process. Or, the bonding pad 24, the fuse 26, and the conductive plugs 22 are simultaneously formed in a dual damascene process.

As shown in FIG. 1, the fuse structure 10 further comprises a third dielectric layer 32 and an opening 34 in the third dielectric layer 32. The third dielectric layer 32 is disposed on the second dielectric layer 18, the bonding pad 24, and the fuse 26. The opening 34 exposes portions of the bonding pad 24. The metal material of the bonding pad 24 is thus exposed so the testing and packaging processes can be performed. The third dielectric layer 32 is also called as a passivation layer. In addition, the third dielectric layer 32 is a transparent material layer. Actually, an etching back process is performed from the top surface of a third dielectric thin film (not shown) downwards to form the thin third dielectric layer 32 so the laser beam is able to transmit and sever the fuse 26 in the subsequent laser zip process.

Since the composition material for both the bonding pad 24 and the fuse 26 comprise aluminum or copper, the fuse 26 is an aluminum fuse or a copper fuse. When the fuse 26 is a copper fuse, the fuse 26 is usually formed by performing an electroplating process in a dual damascene process, which is previously mentioned. However, copper is difficult to evaporate during the laser zip process because of its high melting point. A splash phenomenon results and causes difficulty in assuring high reliability. If the fuse 26 is an aluminum fuse, its thickness is increased in the process generation beyond 0.13 μm to prevent the occurrence of an open circuit due to the electromigration tendency of aluminum. To increase the thickness of the fuse 26 brings difficulty to the process, and it is difficult to sever the fuse 26. Although the energy of laser beam can be adjusted by adjusting the laser spot size, however, the higher the energy of laser beam, the higher probability of damaging the structure underneath. If the conductive plug 22 is an aluminum conductive plug, its poor step coverage ability easily induces problems.

It is therefore very important to develop a new fuse structure. This fuse structure should not bring difficulty to the subsequent laser zip process no matter what composition materials for both the bonding pad and the fuse are.

SUMMARY OF INVENTION

It is therefore a primary objective of the claimed invention to provide a fuse structure, especially a fuse structure having a fuse including a thin portion and a thick portion formed from a single-layered material to resolve the above-mentioned problems.

According to the claimed invention, a metal layer structure is provided. The metal layer structure comprises a substrate, a first dielectric layer on a surface of the substrate, at least one first conductor on the first dielectric layer, and at least one second conductor on the first dielectric layer. The second conductor has at least one thin portion.

It is an advantage of the claimed invention that the fuse structure comprises the exposed fuse having an obviously smaller thickness than that of the bonding pad. Therefore, the fuse will not be too thick to sever during the subsequent laser zip process. Furthermore, the fourth dielectric layer disposed on top of the fuse is formed by a deposition process, in other words, without performing any etching back process. As a result, the thickness uniformity of the fourth dielectric layer covering the surface of the exposed fuse is better than the oxide layer formed by the traditional etching back process, leading to a much stable laser zip process. In addition, the bondability of the bonding pad during the packaging process is maintained since the thickness for the bonding pad remains at a predetermined thickness, which is obviously greater than the thickness of the exposed fuse. Moreover, the composition material for the bonding pad may be the same as the fuse, or the composition material for the bonding pad may be different from the fuse. With such a fuse structure, flexibilities are imparted to device design, manufacturing process, laser repair process, and wire bonding process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
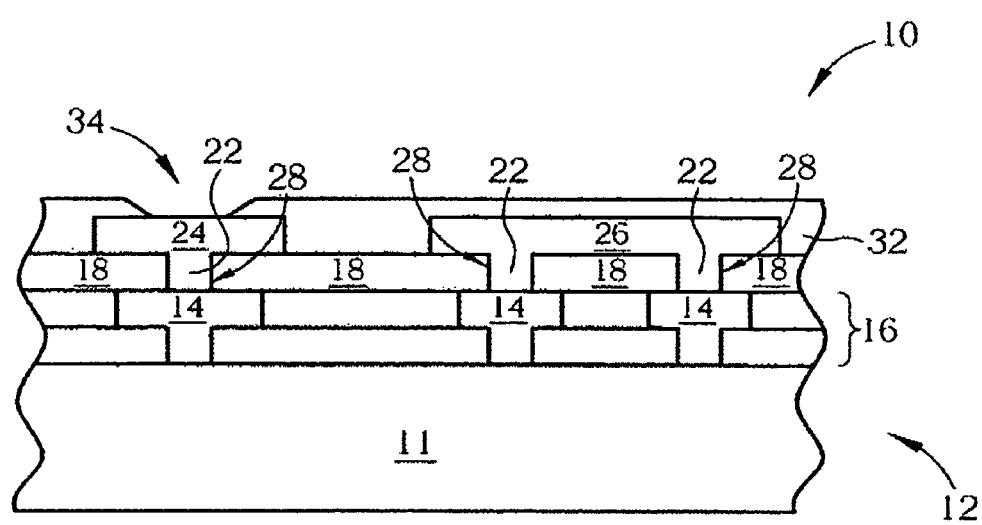
FIG. 1 is a schematic diagram of a fuse structure on a semiconductor wafer according to the prior art.
Figure 2:
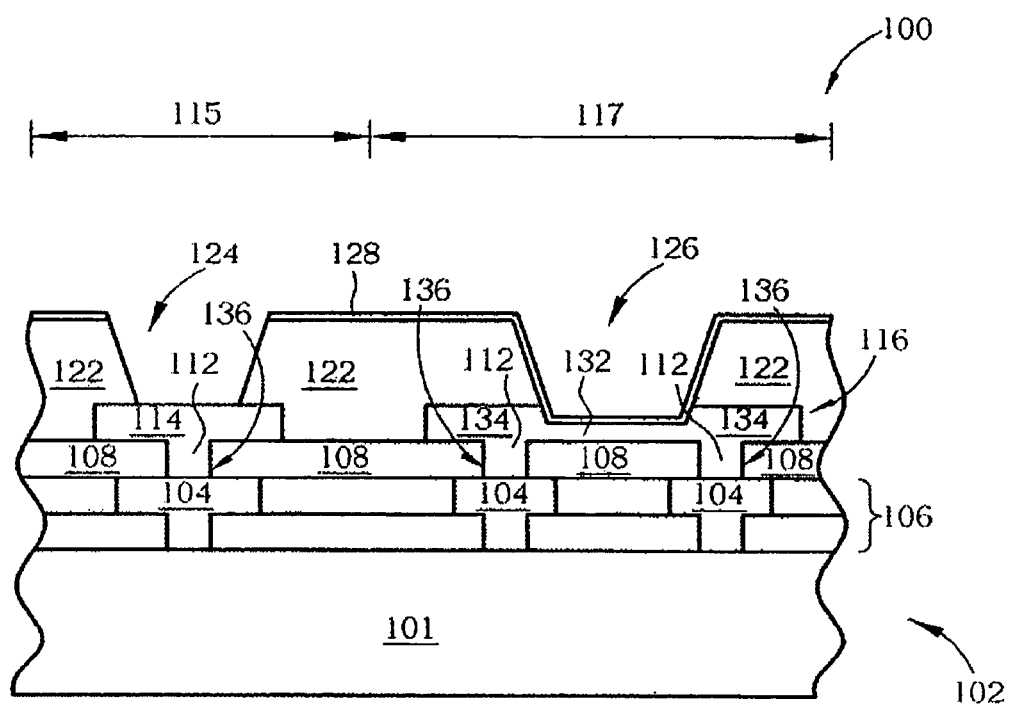
FIG. 2 is a schematic diagram of a fuse structure on a semiconductor wafer according to the present invention.

Please refer to FIG. 2. FIG. 2 is a schematic diagram of a fuse structure 100 on a semiconductor wafer according to the present invention. As shown in FIG. 2, the present invention fuse structure 100 comprises at least one memory cell (not shown) or at least one transistor (not shown) disposed on a silicon substrate 101 on a semiconductor wafer 102 and individual metal lines 104. Different metal lines 104 are isolated by a first dielectric layer 106.

The metal line 104 comprises an aluminum line or a copper line. In the case where the aluminum lines are used, a continuous process including deposition, photolithography, and etching is utilized. In the case where the copper lines are used, a dual damascene process is usually utilized. The reason is that the aluminum lines are usually formed by a DC magnetron sputtering process, which is characterized by its poor step coverage ability. In the process generation beyond 0.13 µm, line width is smaller, aspect ratio is relatively increased, and the poor step coverage ability causes a severe problem. Although a high temperature (>400° C.) aluminum process with an improved step coverage ability due to a high surface migration rate at high temperature has been developed, it is not satisfactory. However, aluminum is easily deposited and etched, and is very cheap as well. Thus, the aluminum line is widely utilized in semiconductor factories. Although the cooper lines are superior to the aluminum lines in terms of electrical performance, the etching process for the copper lines cannot be done in a chemical way because of the poor volatile ability of copper-chloride-alloy, which is a drawback of the copper lines. The copper is etched by physical momentum produced by the bombardment of ions in plasma on the copper, hence the copper lines is formed by the dual damascene process to skip the etching process for copper.

If the metal lines 104 are copper lines, each of them is actually a part of a Cu-dual damascene architecture with the first dielectric layer 106 being a low-k dielectric layer. The dielectric constant of the first dielectric layer 106 is approximately 2.0 to 3.5. The first dielectric layer 106 comprises a carbon-contained oxide layer or an inorganic dielectric material layer.

As shown in FIG. 2, the fuse structure 100 further comprises a second dielectric layer 108 disposed on the first dielectric layer 106 and the metal lines 104, at least one conductive plug 112 disposed in the second dielectric layer 108, at least one bonding pad 114 disposed on the second dielectric layer 108 in a bonding pad area 115, and at least one fuse 116 disposed on the second dielectric layer 108 in a fuse area 117. The composition material for the bonding pad 114 comprises aluminum or copper, and the composition material for the fuse 116 comprises aluminum, copper, or polysilicon.

In addition, the fuse structure 100 further comprises a third dielectric layer 122, a bonding pad opening 124 exposing the bonding pad 114 in the third dielectric layer 122, a fuse opening 126 exposing portions of the fuse 116 in the third dielectric layer 122, and a fourth dielectric layer 128 covering the exposed fuse 116 on the third dielectric layer 122. It is worth noting that the fuse 116 includes a thin portion 132 and a thick portion 134. The thin portion 132 is exposed by the fuse opening 126 and is covered by the fourth dielectric layer 128. The thick portion 134 that surrounds the thin portion 132 is covered by the third dielectric layer 122 and the fourth dielectric layer 128. The third dielectric layer 122 is utilized as a passivation layer. Due to the existence of the bonding pad opening 124, the metal material of the bonding pad 114 is exposed so the testing and packaging processes can be performed. In another respect, the fourth dielectric layer 128, being a PE-oxide layer, is a transparent material layer so the laser beam is able to transmit and sever the thin portion 132 of the fuse 116 in the subsequent laser zip process.

In FIG. 2, a thickness of the bonding pad 114 is equal to a thickness of the thick portion 134. Actually, a ratio of the thickness of the thick portion 134 to a thickness of the thin portion 132 is approximately 1 to 8. Or, the thickness of the thick portion 134 is approximately 0.8 to 1.6 µm, and the thickness of the thin portion 132 is smaller than 0.8 µm. The method for forming the bonding pad opening 124, the fuse opening 126, the thin portion 132, the thick portion 134, and the fourth dielectric layer 128 in the fuse structure 100 according to the present invention is described as following. A third dielectric thin film (not shown) is formed on the silicon substrate 101 first to cover the second dielectric layer 108, the pad 114, and the fuse 116. Then, a photo-etching-process is performed to form the fuse opening 126 by removing the third dielectric thin film (not shown) on top of the fuse 116 with a fuse mask (not shown). An anisotropic dry etching process is thereafter performed to remove a predetermined thickness of the fuse 116 underneath the fuse opening 126 such that the thin portion 132 and the thick portion 134 are formed. After that, a fourth dielectric thin film (not shown) is formed on the entire surface of the silicon substrate 101. Finally, another photo-etching-process is performed to form the bonding pad opening 124 by removing the fourth dielectric thin film (not shown) and the third dielectric thin film (not shown) with a pad mask (not shown). The remaining third dielectric thin film and fourth dielectric thin film are the third dielectric layer 122 and the fourth dielectric layer 128, respectively, as shown in FIG. 2.

However, the thickness of the bonding pad 114 may be different from the thickness of the thick portion 134. No matter what is the situation, the method for forming the present invention fuse structure 100 is not limited to the method described above. For example, the conductive plug 112 may be formed by forming a via hole 136 extending from the top surface of the metal line 104 up to the top surface of the second dielectric layer 108 first, followed by filling metal material into the via hole 136. After that, the bonding pad 114 and the fuse 116 are formed on top of the corresponding conductive plug 112 by utilizing a continuous deposition, photolithography, and anisotropic dry etching process. Finally, the bonding pad opening 124, the fuse opening 126, the thin portion 132, the thick portion 134, and the fourth dielectric layer 128 are formed according to the method described above.

Alternatively, the bonding pad 114, the thin portion 132 of the fuse 116, and the thick portion 134 of the fuse 116 may be formed by utilizing a selective mask (not shown) when the bonding pad 114 and the fuse 116 are formed by utilizing only one continuous deposition, photolithography, and anisotropic dry etching process. The difference between the selective mask (not shown) and a common mask is that the materials in different regions of the selective mask have different transmittance. Therefore, once the photolithography process is performed, a step structure having different heights is formed in the developed photoresist layer (not shown). After an anisotropic dry etching process, the bonding pad 114 and the fuse 116 having different thickness are formed. Furthermore, the bonding pad 114, the thin portion 132 of the fuse 116, and the thick portion 134 of the fuse 116 may be formed by performing repetitive photolithography processes and anisotropic dry etching processes and by utilizing common masks and common hard masks.

Or, the bonding pad 114, the fuse 116, and the conductive plugs 112 may be simultaneously formed in a dual damascene process. Under the circumstances, the fuse 116 can be formed by two dual damascene structures together with a trench between them. Of course, a depth of a trench in the dual damascene structure having the bonding pad 114 must be greater than that of the trench between the two dual damascene structures forming the fuse 116. Therefore, the thickness of the bonding pad 114 is greater than the thickness of the thin portion 132 after the copper filling and CMP processes. Furthermore, the bonding pad 114 and the fuse 116 may be formed by utilizing a continuous deposition, photolithography, and anisotropic dry etching process and a dual damascene process. Or, the bonding pad 114 and the fuse 116 may be formed by utilizing two dual damascene processes.

In addition, the composition material for the bonding pad 114 may be the same as the fuse 116, or the composition material for the bonding pad 114 may be different from the fuse 116. Because different composition materials have different process concerns, one of the previously mentioned processing methods fulfilling practical requirements is utilized. Moreover, the metal structure underneath the bonding pad 114 and the fuse 116 is not limited to the one-layered structure, as shown in FIG. 2. In fact, there may be at least two metal layers underneath the bonding pad 114 and the fuse 116.

The fuse structure according to the present invention comprises the exposed fuse having an obviously smaller thickness than that of the bonding pad. As a result, the fuse will not be too thick to sever during the subsequent laser zip process. At the same time, the bondability of the bonding pad during the packaging process is maintained since the thickness for the bonding pad remains at a predetermined thickness, which is obviously greater than the thickness of the exposed fuse. When applying the present invention fuse structure to a practical production line, semiconductor products having high design flexibility, stable laser repair process, and good wire bonding ability are fabricated.

In contrast to the prior art fuse structure, the present invention fuse structure has the exposed fuse having an obviously smaller thickness than that of the bonding pad. Therefore, the fuse will not be too thick to sever during the subsequent laser zip process. In addition, the fourth dielectric layer disposed on top of the fuse is formed by a deposition process, in other words, without performing any etching back process. As a result, the thickness uniformity of the fourth dielectric layer covering the surface of the exposed fuse is better than the oxide layer formed by the traditional etching back process, leading to a much stable laser zip process. Moreover, the bondability of the bonding pad during the packaging process is maintained since the thickness for the bonding pad remains at a predetermined thickness, which is obviously greater than the thickness of the exposed fuse. In addition, the composition material for the bonding pad may be the same as the fuse, or the composition material for the bonding pad may be different from the fuse. With such a fuse structure, flexibilities are imparted to device design, manufacturing process, laser repair process, and wire bonding process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fuse structure comprising:
a substrate, a fuse area being included on a surface of the substrate;
a first dielectric layer on the surface of the substrate;
at least one metal structure disposed in the first dielectric layer;
a second dielectric layer disposed on the first dielectric layer and the metal structure;
at least one fuse on the second dielectric layer in the fuse area, the fuse having a thin portion and a thick portion;

plurality of conductive plugs disposed in the second dielectric layer for connecting the fuse and the metal structure;

a third dielectric layer on the second dielectric layer that covers the thick portion; and a first opening in the third dielectric layer exposing the thin portion; and a fourth dielectric layer on the third dielectric layer that covers the thin portion of the fuse.

2. The fuse structure of claim 1 wherein a ratio of a thickness of the thick portion to a thickness of the thin portion is approximately 1 to 8.

3. The fuse structure of claim 1 wherein a thickness of the thick portion is approximately 0.8 to 1.6 μm, and a thickness of the thin portion is smaller than 0.8 μm.

4. The fuse structure of claim 1 further comprising:

at least one bonding pad on the second dielectric layer in a bonding pad area; and a second opening in the third dielectric layer exposing the bonding pad.

5. The fuse structure of claim 1 wherein the fourth dielectric layer is a PE-oxide layer.

6. The fuse structure of claim 1 wherein the metal structure is copper (Cu).

7. The fuse structure of claim 1 wherein the first dielectric layer is a low-k dielectric layer.

8. The fuse structure of claim 1 wherein the metal structure is copper, and the first dielectric layer is a low-k dielectric layer.

9. The fuse structure of claim 8 wherein a dielectric constant of the low-k dielectric layer is approximately 2.0 to 3.5.

10. The fuse structure of claim 8 wherein the low-k dielectric layer comprises a carbon-contained oxide layer or an inorganic dielectric material layer.

11. The fuse structure of claim 1 wherein the thick portion and the thin portion of the fuse comprise same material.

* * * * *